United States Patent [19]
Oskarsson

[11] Patent Number: 6,163,556
[45] Date of Patent: Dec. 19, 2000

[54] HIGH POWERED LASER DIODE

[75] Inventor: Vilhelm Oskarsson, Jarfalla, Sweden

[73] Assignee: Mitel Semiconductor AB, Jarfalla, Sweden

[21] Appl. No.: 09/114,143

[22] Filed: Jul. 13, 1998

[30] Foreign Application Priority Data

Jul. 14, 1997 [GB] United Kingdom .................. 9714822

[51] Int. Cl.[7] ...................................... H01S 5/00
[52] U.S. Cl. ................ 372/43; 372/43; 372/44; 372/45; 372/46; 372/47; 372/48; 372/49; 372/50; 372/75; 372/101
[58] Field of Search ........................ 372/43, 75, 44–50, 372/101; 395/511

[56] References Cited

U.S. PATENT DOCUMENTS

| | | |
|---|---|---|
| 4,114,177 | 9/1978 | King . |
| 4,565,924 | 1/1986 | Mitsumi et al. . |
| 4,733,094 | 3/1988 | Carpentier et al. . |
| 5,198,916 | 3/1993 | Kim . |
| 5,258,821 | 11/1993 | Doggett et al. ..................... 356/345 |
| 5,309,542 | 5/1994 | Strope et al. . |
| 5,340,637 | 8/1994 | Okai et al. . |
| 5,838,703 | 11/1998 | Lebby et al. ........................ 372/43 |

*Primary Examiner*—Frank G. Font
*Assistant Examiner*—Delma R. Flores Ruiz
*Attorney, Agent, or Firm*—Laubscher & Laubscher

[57] ABSTRACT

A method of reducing the amount of unwanted radiation emitted from a semiconductor laser device involves coating a transparent portion the device intended to transmit radiation with a partially reflective layer. The transparent portion is typically the lens cap

13 Claims, 1 Drawing Sheet

HIGH POWERED LASER DIODE

FIELD OF THE INVENTION

This invention relates to the field of laser diodes, and more particularly to a high powered laser diode, such as a VCSEL (vertical cavity surface emitting laser).

BACKGROUND OF THE INVENTION

VCSELs inherently produce a high optical power output, and this output cana be significantly higher than the maximum limit for eye safety applicable to many fiber optic systems, such as Fiber channel and Ethernet applications.

As a result one of the problems that has been faced in the prior art is how to maintain adequate power when the VCSEL is coupled to an optical fiber while preventing the VCSEL from emitting dangerous radiation when not attached to a fiber.

Various techniques have been used to make such a diode safe. One technique involves the use of an electromechanical shutter to cut off optical power when the fiber is detached and shut the VCSEL off. Another technique requires the use of a calibrated monitor diode.

SUMMARY OF THE INVENTION

An object of the invention is to provide an effective means of controlling output radiation to maintain it at a safe level.

According to the present invention there is provided a method of reducing the amount of unwanted radiation emitted from a semiconductor laser device comprising coating a transparent outport portion of said device intended to transmit radiation with a partially reflective layer.

In a preferred embodiment the reflective layer is chrome, although other reflective coating materials can be used. The thickness of the reflective layer is chosen so as to make the amount of light passed safe to the human eye.

The laser device is preferably a VCSEL having the reflective layer coated on the inside or outside of the lens in the cap of the device

BRIEF DESCRIPTION OF THE DRAWING

The invention also provides a semiconductor laser device comprising a transparent output portion, and a partially reflective layer on said output portion to reduce the amount of radiation transmitted.

The invention will now be described in more detail, by way of example only, with reference to the accompanying drawings, in which.

DESCRIPTION OF THE PREFERRED EMBODIMENTS

Figure 1:
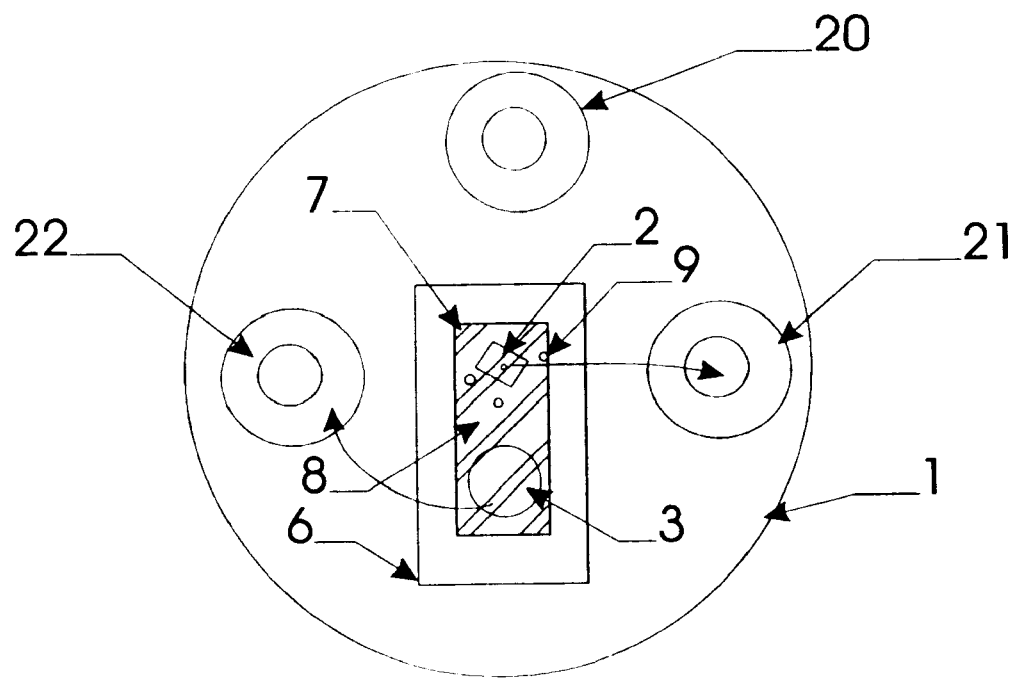
FIG. 1 is a plan view of a VCSEL device embodying the invention with the cap removed.
Figure 2:
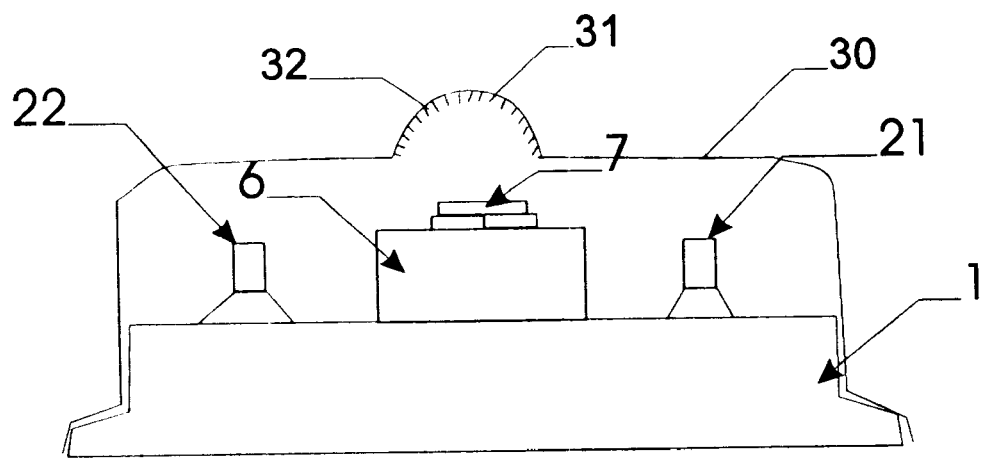
FIG. 2 is a side elevation of the device shown in FIG. 1 with the cap in place

Referring now to FIGS. 1 and 2, the device comprises a base 1 on which is mounted a pedestal 6 supporting VCSEL laser diode 2 and a sensing photodiode 3, which is mounted laterally adjacent the laser diode 2 to provide a monitoring function of the radiation emitted by the laser. Bonding posts 20, 21, 22 are provided on the pedestal 6 in a manner known per se.

A rectangular strip of window glass 7 having a refractive index of 1.5 and about 100 microns thick is placed over the laser diode 2 and photodiode 3 so as to be parallel to the emitting surface 5 of the laser diode 2. The glass strip 7 serves as a waveguide coupling light from the laser to a detector as described in our co-pending application no. 9713607.1. A filler glue 8 optically couples the glass to the laser diode 2 The glass contains dispersant spheres 9.

A cap 30 containing lens 31 is placed over the base in a conventional manner as shown in FIG. 2. in accordance with the principles of the invention, a partially reflective layer of chrome 32 is place on the inside surface of lens 31. This chrome layer typically has a transmissivity of about 20–25%. The thickness of the chrome layer determines the transmissivity and this can be selected as desired for the particular application, an in particular to ensure that the radiation emitted is safe for the human eye. Typically for a 25% transmissivity, the chrome layer is 2600 Å thick and for a 20% transmissivity the chrome layer is 2900 Å. A 3000 Å layer gives a transmissivity of about 19%, and a 2650 Å layer a transmissivity of about 23%.

The chrome layer can be deposited by a conventional deposition technique.

Naturally reflective materials other than chrome can be deposited. The invention is particularly applicable to 1300m VCSELs, and combination VCSELs with an integral monitor function as described in our co-pending application referred to above.

Another important effect of the reflective layer is that it can be used to reflect light to a sensor, such as a photodiode, laterally adjacent the VCSEL and serving a monitoring function. This can obviate the need for a special optical coupling arrangement

I claim:

1. A method of reducing the amount of unwanted radiation emitted from a semiconductor laser device, comprising the steps of providing said device with a transparent output portion intended to transmit radiation, and coating said transparent output portion with a partially reflective layer to reduce the amount of radiation transmitted through said transparent output portion to a safe level.

2. A method as claimed in claim 1, wherein said transparent portion is a lens cap.

3. A method as claimed in claim 1, wherein said reflective layer is deposited internally.

4. A method as claimed in claim 1, wherein said reflective layer is deposited externally.

5. A method as claimed in claim 1, wherein said device is a VCSEL.

6. A method as claimed in claim 1, wherein said reflective layer is chrome.

7. A semiconductor laser devices comprising a transparent output portion, and a partially reflective layer coated on said output portion to reduce the amount of radiation transmitted through said transparent output portion to a safe level.

8. A semiconductor laser as claimed in claim 7, wherein said transparent portion is a lens cap.

9. A semiconductor laser as claimed in claim 8, wherein said reflecting layer is deposited internally.

10. A semiconductor laser as claimed in claim 8, wherein said reflected layer is deposited externally.

11. A semiconductor laser as claimed in claim 10, wherein said device is a VCSEL.

12. A semiconductor laser as claimed in claim 11, wherein said VCSEL has an integral laterally adjacent monitoring device for monitoring the radiation emitted by the laser.

13. A semiconductor laser as claimed in claim 8, wherein said reflective layer is chrome.

* * * * *